United States Patent [19]

Clark

[11] 4,403,238
[45] Sep. 6, 1983

[54] DETECTOR ARRAY FOCAL PLANE CONFIGURATION

[75] Inventor: Stewart A. Clark, Huntington Beach, Calif.

[73] Assignee: Irvine Sensors Corporation, Costa Mesa, Calif.

[21] Appl. No.: 213,933

[22] Filed: Dec. 8, 1980

[51] Int. Cl.³ ............................................. H01L 27/14
[52] U.S. Cl. .......................................... 357/30; 357/76
[58] Field of Search ...................................... 357/30, 76

[56] References Cited

U.S. PATENT DOCUMENTS 3,852,714 12/1974 Carson ......................... 340/146.3 F

*Primary Examiner*—Deborah L. Kyle
*Attorney, Agent, or Firm*—Thomas J. Plante

[57] ABSTRACT

A focal plane photo-detector mosaic array is disclosed in which thin stacked substrate layers extending in planes perpendicular to the focal plane provide closely spaced electrical contact points at the focal plane, and photo-detectors on the focal plane which individually communicate with those contact points are arranged in rows extending diagonally with respect to the planes in which the stacked substrate layers extend.

10 Claims, 5 Drawing Figures

DETECTOR ARRAY FOCAL PLANE CONFIGURATION

BACKGROUND OF THE INVENTION

This invention relates to the field of electro-optical detecting apparatus which utilizes "mosaic" detector arrays to provide surveillance of an extensive scene. The mosaic detector arrays are large numbers of closely spaced individual photodetector elements arranged in essentially a two-dimensional, or planar, array.

In patent application Ser. No. 187,787, filed Sept. 16, 1980 and assigned to the assignee of this application, a detector array module is disclosed which comprises a stack of semiconductor chips, or layers, extending at right angles to the focal plane of the detector array, which array comprises a multiplicity of separate photodetectors each in electrical contact with a single electrical lead formed as one of a multiplicity of such leads which appear on the focal plane ends of the stacked chips. Each of the chips as integrated electronic circuitry which processes signals from the detectors prior to transmitting output signals to electronic processing circuits located remote from the focal plane assembly. The complete focal plane assembly is constructed by combining a large number of the modules.

The goal of such structures is to derive individual detector signals from photo-detectors which have a very small center-to-center distance, in order to provide optimum resolution of the incoming optical information. The desired spacing of the detectors is determined by the size of the optics system in the sensor. Longer focal lengths in the optics system permit greater spacing of the detectors. There is a design trade-off between the dimensions of the focal plane and the optics, on the one hand, and the size and spacing of the detectors, on the other hand.

Compact optical receiving systems require small, closely spaced detectors. Except for the diffraction limit, the desire is to increase to the maximum the number of individual detectors in a given focal plane area. It is desirable to obtain the smallest possible F-number, which is the ratio of focal length of the optics to the diameter of the input aperture. The optimum relationship is as follows: $d = 0.1 \cdot \lambda \cdot F/no.$, where d=detector size in mils, and $\lambda$=wavelength in microns. For infrared radiation in the 8-12 micron region, with an F/no. of 1.5, the ideal center-to-center detector distance is about 1.5 mils; and for infra-red radiation in the 3-5 micron range, with an F/no. of 1.5, the ideal center-to-center detector distance is about 0.75 mil. In units presently under development, the minimum distance is about 4 mils.

The primary deterrent to reducing the distance is the required thickness of each layer. If the layers are too thin, they will be very fragile, and will therefore be extremely difficult to handle during fabrication of the multi-layer modules. The problem of layer fragility is, in fact, a significant one where a 4 mil dimension is used.

The purpose of the present invention is to significantly improve the strength of the layers and/or the closeness of the detector centers. In other words, the goal is to make it possible to bring the detectors closer together, given the limitation imposed by the strength requirement of the layers.

SUMMARY OF THE INVENTION

The present invention accomplishes the foregoing purpose by orienting the detector rows along lines which extend diagonally with respect to the planes in which the layers extend, thereby permitting the distance between adjacent detector rows to be less than the thickness of a given layer. This benefit can be used to reduce fragility of the layers, or to reduce the distance between detectors, or to obtain a combination of those advantages.

Dr

DETAILED DESCRIPTION OF THE DRAWINGS

DETAILED DESCRIPTION OF PREFERRED EMBODIMENT

In order to provide a clear explanation of the present invention, it is convenient to discuss it in the environment of the disclosure of application Ser. No. 187,787, wherein the module comprises a stack of silicon (semiconductor) chips. It should be understood, however, that the concept disclosed in the present application is also applicable to any detector array module which comprises stacked layers extending in planes which are perpendicular to the focal plane, such as the structure disclosed in Carson and Dahlgren application Ser. No. 855,242, filed Nov. 28, 1977.

Figure 1:
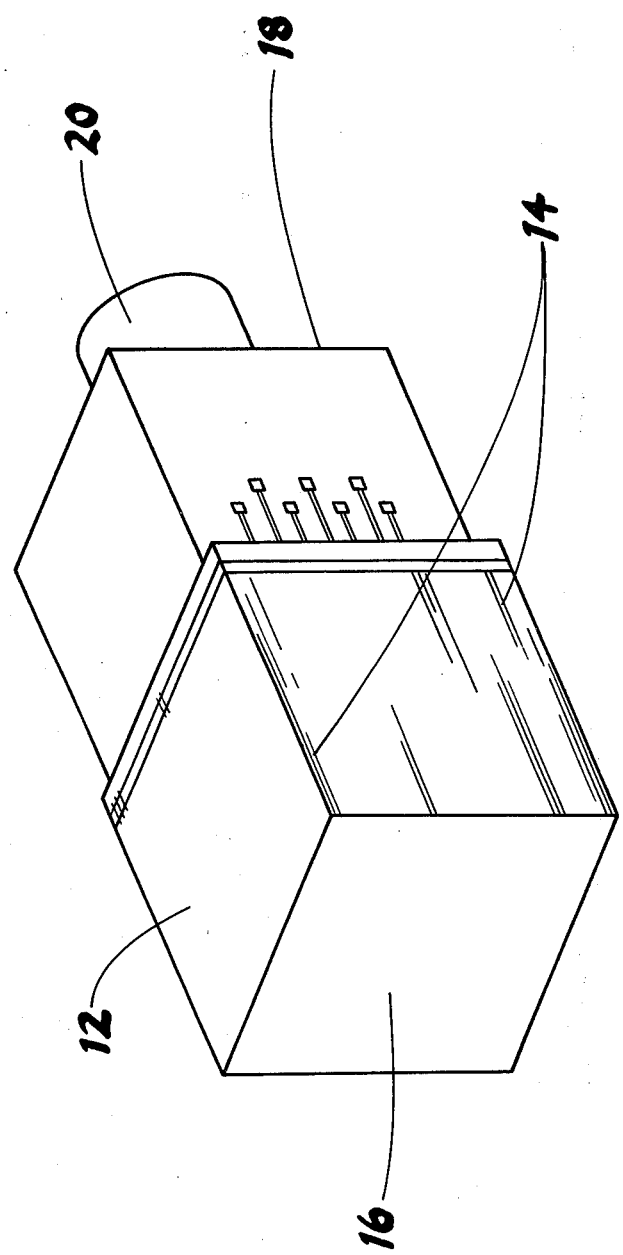
FIGS. 1 and 2 are substantially identical to the correspondingly numbered figures in application Ser. No. 187,787, FIG. 1 showing in perspective an assembled module comprising a number of stacked layers, and FIG. 2 being a partially exploded view of the same module.

FIG. 1 shows a module 12 comprising a multiplicity of layers 14, each of which is a semiconductor chip (preferably silicon) which carries an integrated circuit having suitable electrical leads terminating at a front, or focal, plane 16, where they are individually in electrical contact with separate very closely spaced photo-detectors. The module 12 is in effect, a stack, or "sandwich," comprising numerous silicon chips, or substrates, secured together by suitable adhesive material between adjacent chips. The stack of chips is mounted on a supporting block 18, which also functions as a heat-transfer, or cooling, structure, and which may have a mounting stud 20 for use in securing the module and its supporting block in a larger assembly. Generally the combination of the stack of silicon chips and the supporting block is considered to be a module assembly.

Figure 2:
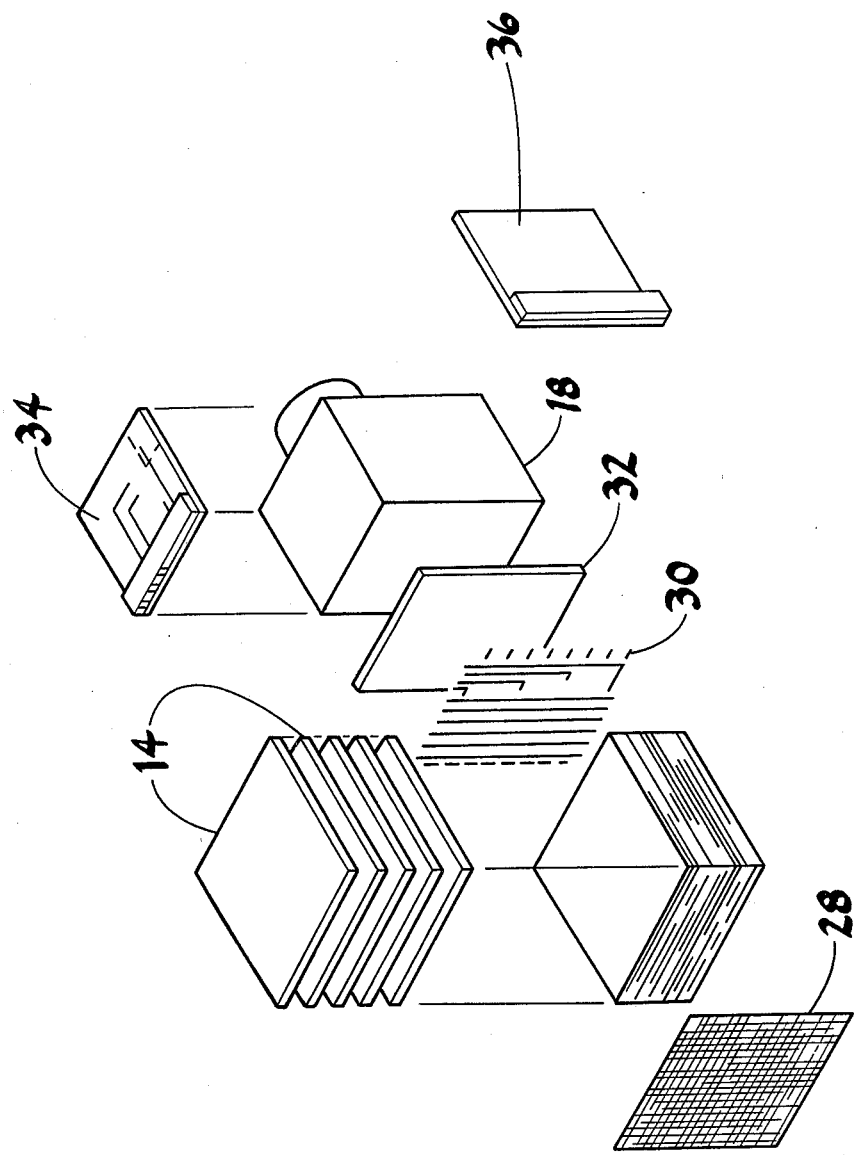

Referring now to FIG. 2, which is an exploded view of module 12, it is seen that it includes separately formed silicon chips 14 which, after being stacked and glued together, are provided on the front, or focal, plane with a detector "mosaic" 28 and on the rear, or back, plane with back plane wiring 30. The supporting block 18 is preferably molybdenum, selected because of its thermal compatibility with silicon. It is insulated from the back plane of the silicon substrate stack by a flat insulating board 32, preferably formed of silicon having silicon oxide grown or deposited on its surfaces. Two additional insulating boards 34 and 36, also preferably formed of silicon, are secured to two sides of molybdenum block 18, and are arranged to carry lead-out conductors from the back plane wiring 30 to ribbon cables (not shown).

Application Ser. No. 187,787, which is incorporated herein by reference for disclosure purposes, explains in detail the processes used to form a stack of silicon chips which provide a focal plane having a multiplicity of separate electrical leads which appear at the focal plane. These leads are formed by thin film deposition techniques on one surface of each silicon layer.

Figure 3:
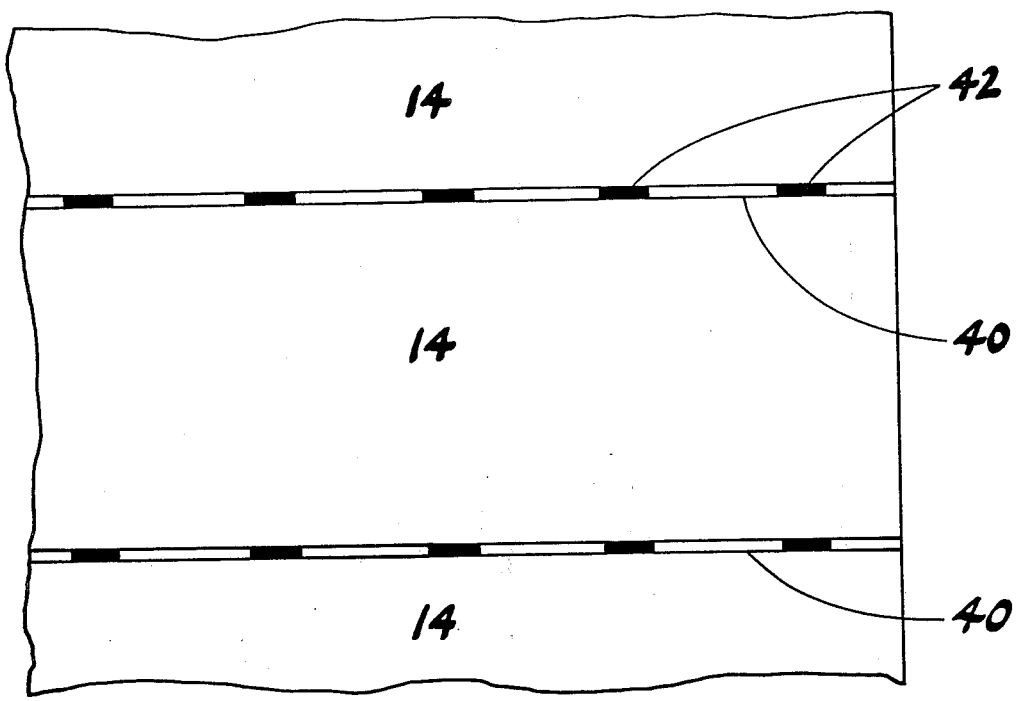
FIG. 3 is a closeup view of the electrical leads which extend to the focal plane of the module.

FIG. 3 is a closeup of a small portion of the focal plane showing the spatial relationship of a number of electrical leads which intersect the focal plane. A surface 40 of each of the silicon chip layers 14 carries thereon a multiplicity of closely spaced electrical leads 42, each of which is electrically isolated from all the others. The leads, because they have been deposited as thin film strips on the surface of each layer, will normally have a width of approximately 0.0005 to 0.001 inch and a thickness of approximately 10,000 A°. It will be noted that the spacing between adjacent leads on a given layer is substantially smaller than the thickness of each layer. If we assume a layer thickness of approximately 0.0028 inch, the center-to-center distance between adjacent leads on the same layer will be about 0.0014 inch. The reason for this 2 to 1 ratio of layer thickness to spacing of adjacent leads is the novel detector arrangement discussed below.

Figure 4:
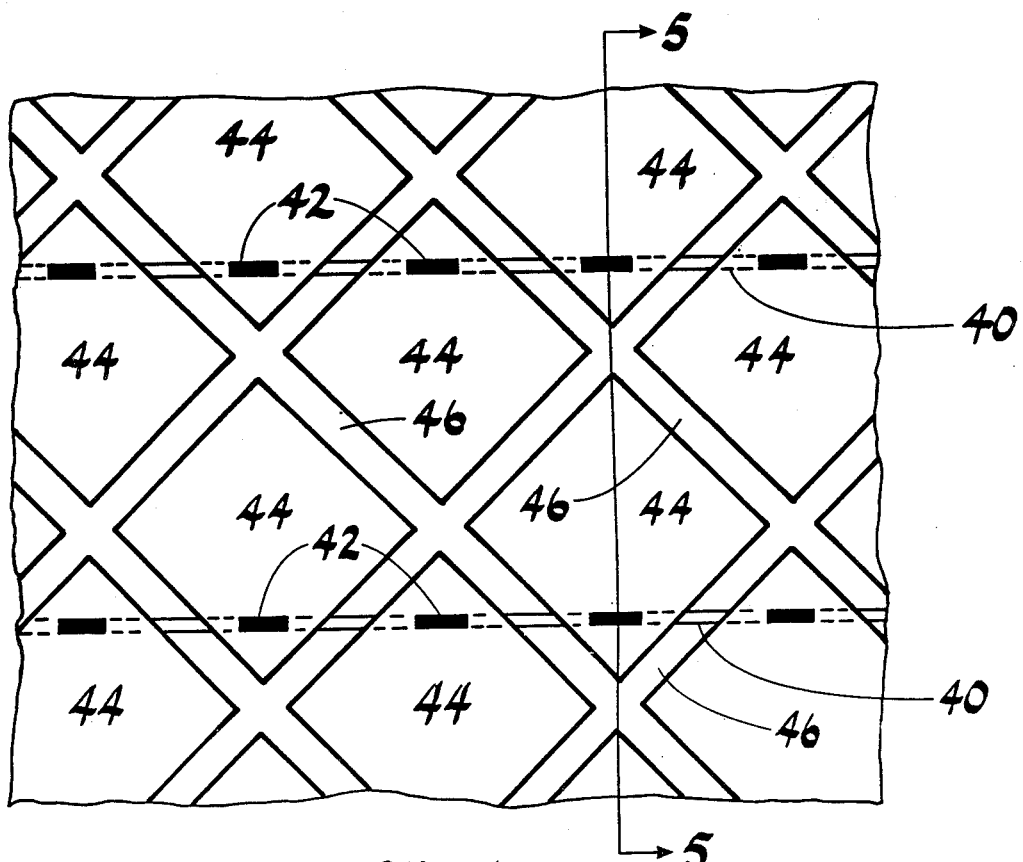
FIG. 4 is a closeup view, similar to FIG. 3, showing the positions of the photo-detectors on top of the module in individual electrical contact with the respective leads.
Figure 5:
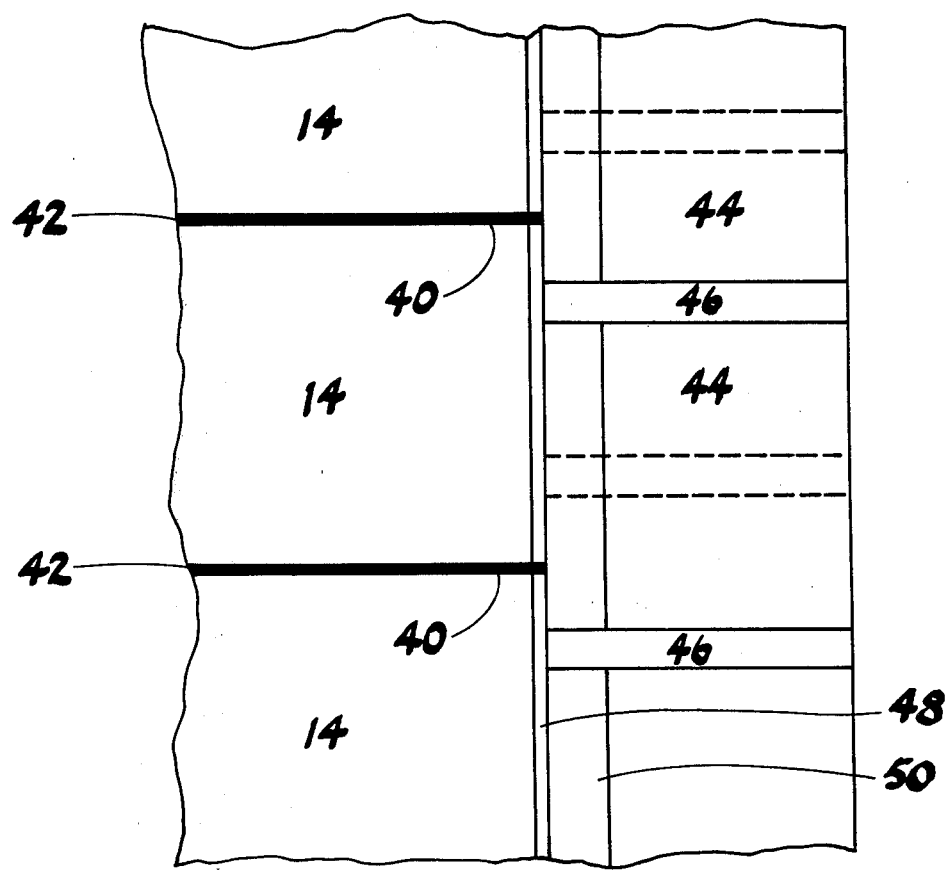
FIG. 5 is a cross-sectional view taken on the line 5—5 of FIG. 4.

FIGS. 4 and 5 show the photo-detectors in place on top of the focal plane. Each photo-detector 44 is spaced from adjacent photo-detectors by channels 46, thereby isolating the individual photo-detectors electrically. The center-to-center spacing between adjacent photo-detectors should be the same throughout the area of the focal plane.

The photo-detectors, which are preferably essentially square in shape, as shown, are arranged in rows which extend diagonally across the focal plane. In other words, the rows of photo-detectors are at 45° angles with respect to the planes in which the layers 14 extend. As a result of this diagonal relationship, the thickness of each layer is substantially equal to the diagonal of a square having its side equal to the distance between the centers of adjacent detectors.

With this arrangement, the center-to-center distance between adjacent detectors 44 is substantially less than the thickness of the layers 14. Each layer has a thickness equal to 1.414 ($\sqrt{2}$) times the detector distance. As previously stated, this spatial relationship can be used either to reduce the detector distance, or to increase the layer thickness, or to provide a combination of those two design changes. In the example of dimensions previously mentioned, assuming a layer thickness of about 0.0028 inch, the detector center-to-center spacing would be about 0.002 inch. And the same ratio applies to the spacing of the detectors and the lateral spacing of the leads, the former being 1.414 ($\sqrt{2}$) times the latter. So, as already stated, the centers of adjacent leads on the same layer would be spaced about 0.0014 inch if the detector centers are about 0.002 inch apart.

As shown, each electrical lead 42 makes contact with its detector 44 near one corner of the detector. This requires extreme accuracy of detector placement, such as that provided by the process disclosed in Rotolante and Koehler application Ser. No. 15,070, filed Feb. 26, 1979.

In FIG. 4, the leads 42 are shown in the same way as they are in FIG. 3, even though the detectors 44 have been placed on top of the leads in FIG. 4. In FIG. 5, numeral 48 indicates a layer of passivation, or insulation, which covers the ends of substrate layers 14 at the focal plane, except for the ends of the electrical leads 40; and numeral 50 indicates the "islands" of conductive epoxy which secure each detector to the focal plane on top of passivation layer 48. Electrical conduction from each photo-detector 44 reaches its respective electrical lead 40 through the epoxy layer 50. As described in detail in application Ser. No. 187,787, each photo-detector 44 may be electrically isolated from all other photo-detectors by means of a process which cuts the channels 46 through both a wafer of detector material and an initial uninterrupted layer of conductive epoxy.

While the invention disclosed herein is simple structurally, it provides very significant advantages in solving the problems discussed above. The development of optimum focal plane arrays of photo-detectors will be substantially advanced by incorporation of the concept explained herein.

The following claims are intended not only to cover the specific embodiments disclosed, but also to cover the inventive concepts explained herein with the maximum breadth and comprehensiveness permitted by the prior art.

I claim:

1. A focal plane photo-detector array structure comprising:
   a plurality of stacked layers secured together and extending in parallel planes perpendicular to the focal plane, each layer providing a multiplicity of spaced electrical contact points at the focal plane; and
   a multiplicity of photo-detectors arranged in parallel rows and secured to the focal plane ends of the stacked layers, each photo-detector being in electrical contact with a single electrical contact point;
   said photo-detectors each being substantially square and so oriented that one of the diagonals of the square is substantially parallel to, and the other is substantially perpendicular to, the planes in which the stacked layers extend, the thickness of each layer being substantially equal to the diagonal of a square having a side equal to the distance between the centers of adjacent detectors.

2. A focal plane photo-detector array structure comprising:
   a plurality of stacked substrate layers secured together and extending in parallel planes perpendicular to the focal plane, each layer providing a multiplicity of spaced electrical contact points at the focal plane; and
   a multiplicity of photo-detectors arranged in parallel rows and secured to the focal plane ends of the stacked layers, each photo-detector being in electrical contact with a single electrical contact point;
   the parallel rows of photo-detectors being diagonally oriented with respect to the parallel planes in which the substrate layers extend, thereby providing a substantially lesser center-to-center distance between adjacent electrical contact points on each layer than the center-to-center distance between adjacent photo-detectors in each row.

3. The focal plane photo-detector array structure of claim 1 or claim 2 in which the thickness of each layer is about $\sqrt{2}$ times the center-to-center spacing of adjacent photo-detectors.

4. The focal plane photo-detector array structure of claim 1 or claim 2 wherein the center-to-center spacing of adjacent electrical contact points on each layer is about one-half the thickness of a substrate layer.

5. The focal plane photo-detector array structure of claim 4 wherein each electrical contact point on the focal plane contacts the respective photo-detector near one corner of the latter.

6. The focal plane photo-detector array structure of claim 1 or claim 2 wherein the stacked layers are silicon chips carrying integrated circuitry communicating with the spaced electrical contact points thereon.

7. The focal plane photo-detector array structure of claim 1 wherein the center-to-center spacing of adjacent photodetectors in each row is about $\sqrt{2}$ times the center-to-center spacing of adjacent electrical contact points on each layer.

8. The focal plane photo-detector array structure of claim 1 wherein each electrical contact point on the focal plane contacts the respective photo-detector near one corner of the latter.

9. The focal plane photo-detector array structure of claim 2 wherein the center-to-center spacing of adjacent photo-detectors in each row is about $\sqrt{2}$ times the center-to-center spacing of adjacent electrical contact points on each layer.

10. The focal plane photo-detector array structure of claim 2 wherein each electrical contact point on the focal plane contacts the respective photo-detector near one corner of the latter.

* * * * *